United States Patent
Utsunomiya (10) Patent No.: US 6,814,832 B2
(45) Date of Patent: Nov. 9, 2004

(54) METHOD FOR TRANSFERRING ELEMENT, METHOD FOR PRODUCING ELEMENT, INTEGRATED CIRCUIT, CIRCUIT BOARD, ELECTRO-OPTICAL DEVICE, IC CARD, AND ELECTRONIC APPLIANCE

(75) Inventor: Sumio Utsunomiya, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/201,721

(22) Filed: Jul. 24, 2002

(65) Prior Publication Data

US 2003/0024635 A1 Feb. 6, 2003

(30) Foreign Application Priority Data

Jul. 24, 2001 (JP) ......................................... 2001-223434

(51) Int. Cl.⁷ ......................... B32B 31/20; B32B 31/28; B05D 5/12; H01L 29/02; H01L 21/30
(52) U.S. Cl. ........................ 156/230; 156/235; 156/247; 156/289; 156/344; 216/13; 427/96; 427/146; 428/620; 438/455
(58) Field of Search ................................. 156/230, 233, 156/235, 241, 239, 247, 344, 289; 216/13, 18, 20; 428/620, 914; 438/974, 977, 455, 149, 458, 461; 427/146, 147, 148, 96, 108, 117

(56) References Cited

U.S. PATENT DOCUMENTS 6,521,511 B1 * 2/2003 Inoue et al. ................. 438/458

FOREIGN PATENT DOCUMENTS

| JP | A 10-12529 | 1/1998 | | |
|---|---|---|---|---|
| JP | A 10-12530 | 1/1998 | | |
| JP | A 10-12531 | 1/1998 | | |
| JP | 10-125929 A | 5/1998 | | |
| JP | 10-125930 A | 5/1998 | | |
| JP | 10-125931 A | 5/1998 | | |
| JP | A 10-177187 | 6/1998 | | |
| JP | A 10-206896 | 8/1998 | | |
| JP | A 11-20360 | 1/1999 | | |
| JP | A 11-24106 | 1/1999 | | |
| JP | A 11-26733 | 1/1999 | | |
| JP | A 11-26734 | 1/1999 | | |
| JP | A1-74533 | 3/1999 | | |
| JP | A 11-97556 | 4/1999 | | |
| JP | A 11-243209 | 9/1999 | | |
| JP | 11-243209 | * 9/1999 | ......... H01L/29/786 | |
| JP | A 11-251517 | 9/1999 | | |
| JP | A 11-251518 | 9/1999 | | |
| JP | A 11-312811 | 11/1999 | | |
| JP | A 2000-133809 | 5/2000 | | |
| JP | A 2000-235348 | 8/2000 | | |
| JP | A 2001-166301 | 6/2001 | | |
| JP | A 2001-189460 | 7/2001 | | |
| WO | WO99/01899 | * 1/1999 | ........... H01L/27/12 | |

* cited by examiner

Primary Examiner—J. A. Lorengo
(74) Attorney, Agent, or Firm—Oliff & Berridge, PLC (57) ABSTRACT

A peeling layer 2 is formed on an element-forming substrate 1, an element-forming layer 3 including an electrical element is formed on the peeling layer, the element-forming layer is joined by means of a dissolvable bonding layer 4 to a temporary transfer substrate 5, the bonding force of the peeling layer is weakened to peel the element-forming layer from the element-forming substrate, the layer is moved to the temporary transfer substrate 5 side, a curable resin 6 is applied onto the element-forming layer 3 which has been moved onto the temporary transfer substrate 5, the resin is cured to form a transfer substrate 6, and the bonding layer 4 is dissolved to peel the temporary transfer substrate 5 from the transfer substrate 6, resulting in a structure in which a transfer substrate is formed directly on the element-forming layer 3. The separation and transfer technique can be used to form a substrate with better flexibility and impact resistance directly on a semiconductor element, without an adhesive layer on the semiconductor device that is produced.

27 Claims, 7 Drawing Sheets

LIGHT IRRADIATION

LIGHT IRRADIATION

METHOD FOR TRANSFERRING ELEMENT, METHOD FOR PRODUCING ELEMENT, INTEGRATED CIRCUIT, CIRCUIT BOARD, ELECTRO-OPTICAL DEVICE, IC CARD, AND ELECTRONIC APPLIANCE

BACKGROUND OF THE INVENTION

1. Field of the Invention

The present invention relates to a method for producing a semiconductor device using a technique for transferring thin-film elements between substrates.

2. Description of the Related Art

It is sometimes desirable to use plastic substrates for substrates in order to lower costs and prevent breakage caused by flaking or deformation in semiconductor devices such as liquid crystal display (LCD) panels and electroluminescence (EL) displays.

However, processes involving elevated temperatures are employed in the production of thin-film transistors which are used in such panel types of displays, yet circuit elements such as EL elements and plastic substrates are susceptible to such elevated temperatures.

The Applicant has proposed a transfer technique for producing semiconductor application devices by forming a semiconductor device on a heat-resistant base substrate using a conventional semiconductor-forming technique which includes a high-temperature process, then peeling the element-forming film (layer) with which the semiconductor device is formed from the substrate, and laminating the film to a plastic substrate. The details are described, for example, in "Method of Peeling" in Japanese Unexamined Patent Applications (Kokai) 10-125929, 10-125930, and 10-125931.

Semiconductor devices produced with the use of the aforementioned method of peeling include structures such as thin-film transistors and similar element-forming layers, adhesive layers to which an adhesive has been applied, and plastic substrates, but the film thickness of the adhesive is about 10 to 100 $\mu$m, and the thickness of the substrate is about 50 to 500 $\mu$m, resulting in a semiconductor device with a relatively high overall thickness. The adhesive must also allow both the element-forming layer and substrate to adhere (be joined). Furthermore, differences in the coefficient of thermal expansion between the layers including the adhesive can cause warping and cracks, possibly lowering the heat resistance (reliability) of semiconductor application devices.

SUMMARY OF THE INVENTION

An object of the present invention is thus to provide a semiconductor device without an adhesive layer for semiconductor devices which are produced using a technique for peeling an element-forming layer from a heat-resistant substrate to transfer the layer to another substrate.

Another object of the present invention is to produce a thinner semiconductor device from a semiconductor device produced by a manufacturing process involving the use of a separation and transfer technique.

Another object of the present invention is to produce a semiconductor device with better heat resistance from a semiconductor device produced by a manufacturing process involving the use of a peeling and transfer technique.

A first method for transferring an element in the present invention in order to achieve the aforementioned objects comprises the steps of forming a peeling layer in which the bonding force weakens under certain conditions on an element-forming substrate for forming an element; forming an element-forming layer including an element on the peeling layer; joining the element-forming layer by means of a dissolvable bonding layer to a temporary transfer substrate; weakening the bonding force of the peeling layer to peel the element-forming layer from the element-forming substrate, and moving the layer to the temporary transfer substrate side; applying resin onto the element-forming layer which has been moved to the temporary transfer substrate, and curing the resin to form a transfer substrate; and dissolving the bonding layer to peel the temporary transfer substrate from the transfer substrate.

Such a structure can be produced to join the transfer substrate and the element-forming substrate without an adhesive layer between them, thus allowing a thinner semiconductor device to be formed. Because the conventional three-layer structure involving an element-forming layer (such as a thin-film transistor), an adhesive layer (adhesive), and a transfer substrate (plastic substrate) can be converted to a two-layer structure (element-forming layer, transfer substrate), it is easier to ensure that the coefficients of thermal expansion of the layers are closer together in order to minimize warpage and cracks.

A second method for transferring an element in the present invention comprises the steps of forming a peeling layer in which the bonding force weakens under certain conditions on an element-forming substrate for forming an element; forming an element-forming layer including an element on the peeling layer; applying resin onto the element-forming layer, and curing the resin to form a transfer substrate; and weakening the bonding force of the peeling layer to peel the element-forming substrate from the element-forming layer, and moving the element-forming layer to the transfer substrate side.

Such a structure can be produced to join the transfer substrate and the element-forming substrate without an adhesive layer between them, thus allowing a thinner semiconductor device to be formed. In this case, the element-forming layer can be formed with fewer steps.

The present invention can also further comprise the step of opening contact holes in the element-forming layer to form a wired layer or electrode layer, and can thus include elements and wiring/electrodes or the like on the inverted element-forming layer.

In the present invention, "element" includes TFT, diodes, resistors, inductors, capacitors, and other unit elements, whether active or passive elements, of any structure, shape, or size.

In the present invention, "peeling layer" is preferably a peeling layer in which the bonding force between atoms or molecules is lost or diminished when irradiated by light such as laser beams, resulting in peeling, and is made of a material that undergoes such peeling.

The peeling layer is preferably made of at least one material selected from the group consisting of amorphous silicon, silicon nitride, and metals, and may also be a multilayered film made of a combination thereof. This makes it easier to bring about separation in the peeling layer and in the interface between the peeling layer and adjacent layers. For example, silicone nitride contains nitrogen, and the nitrogen separated when irradiated with light rays, weakening the bonding force between molecules.

The peeling layer preferably includes hydrogen. the hydrogen will thus separate (become a gas) when irradiated with light rays, weakening the bonding force between molecules.

The bonding layer is preferably a liquid dissolvable adhesive such as a water-soluble adhesive, which dissolves away when washed with water.

The present invention also relates to a method for producing an element, comprising the steps in the aforementioned method for transferring an element. It also relates to an integrated circuit produced by such a transfer method.

In the present invention, "integrated circuit" refers to a circuit in which elements and wiring are integrated to perform a certain function. For example, "integrated circuit" refers to circuits comprising a plurality of active elements (such as thin-film transistors) or passive elements (such as resistors and capacitors) formed on the same substrate (in the present invention, the final transfer substrate) by means of a chemical technique such as ion implantation, diffusion, or photoetching. Such circuits are classified, depending on the degree of integration, into small-scale integrated circuits (such as NAND circuits and NOR circuits), medium-scale integrated circuits (such as counters and resistor circuits), and large-scale integrated circuits (such as memory, microprocessors, and DSP).

The present invention also relates to circuit boards produced by the aforementioned method for transferring an element. Examples include a circuit board comprising elements disposed in a plurality of two-dimensionally disposed pixel electrodes, such as an active matrix substrate, which has been produced by the aforementioned method for transferring an element.

The present invention also relates to an electro-optical device comprising such a circuit board.

As used here, "electro-optical device" generally refers to devices with electro-optical elements which emit light or modify light from elsewhere by means of electrical action, and include both those that emit light themselves and those that control the transmission of light from elsewhere. Examples include active matrix types of displays equipped with electro-optical elements such as liquid crystal elements, electrophoresis elements, EL (electroluminescence) elements, and electron-emitting elements that emit light when electrons produced by the application of an electrical field come into contact with a light-emitting board. Such devices are not limited to these, of course.

The present invention also relate to an electronic appliance produced by the aforementioned method for transferring an element.

As used here, "electronic appliance" generally refers to devices that have a certain function as a result of a combination of a plurality of elements or circuits. Although the structure is not particularly limited, examples include IC cards, cellular telephones, video cameras, personal computers, head-mounted displays, rear or front projectors, as well as FAX machines with display functions, digital camera finders, portable TV, DSP devices, PDA, electronic organizers, electronic signs, and displays for advertising announcements.

BRIEF DESCRIPTION OF THE DRAWINGS

FIGS. 4A through 4C are examples of integrated circuits relating to the present invention, where

FIGS. 6A through 6F are examples of electronic appliances relating to the present invention, where FIG. 6A shows a cellular telephone, FIG. 6B a video camera, FIG. 6C a portable personal computer, FIG. 6D a head-mounted display, FIG. 6E a rear projector, and FIG. 6F a front projector.

DESCRIPTION OF THE PREFERRED EMBODIMENTS

Preferred embodiments of the present invention are illustrated below with reference to the drawings.

First Embodiment

The first embodiment of the present invention relates to a first method for transferring an element, in which an element-forming layer is joined by means of a dissolvable bonding layer to a temporary transfer substrate, resin is applied to the element-forming layer when it has been transferred to the temporary transfer substrate to form a transfer substrate, and the bonding layer to which it is joined is dissolved to peel the temporary transfer substrate from the transfer substrate. That is, the first embodiment relates to a method in which the transfer substrate serving as the final substrate is formed after the layer has been transferred, and the substrate to which the layer was initially transferred is then removed.

FIGS. 1A through 1E illustrate the process (steps) for producing an element in the first embodiment of the invention.

Figure 1A:
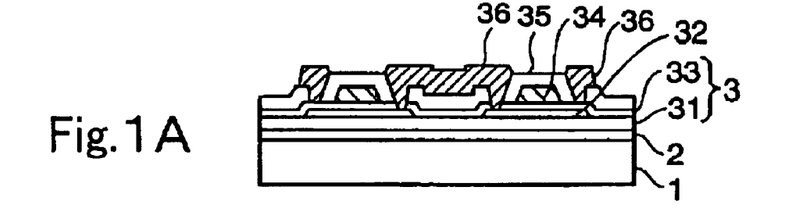
FIGS. 1A through 1E are cross sectional views of the production process illustrating a first embodiment of the present invention.

First, as illustrated in FIG. 1A, a light-transmitting heat-resistant substrate 1 such as quartz glass that is resistant up to about 1000° C., for example, is made into an element-forming substrate.

The element-forming substrate 1 used here should have light-transmitting properties permitting light to pass through it. This will allow light to pass through the substrate to the peeling layer, ensuring rapid and proper separation of the peeling layer. The light transmittance should be at least 10%, and preferably at least 50%. The higher the light transmittance, the lower the light loss, allowing the peeling layer 2 to be separated with lower amounts of light.

The substrate 1 should be made of a highly reliable material, and preferably a material with excellent heat resistance. That is because when the element-forming layer or interlayer described below, for example, is formed, the processing temperature is sometimes high (about 350 to 1000° C., for example) depending on the type of layer or the forming method, but if the element-forming substrate 1 has excellent heat resistance in such cases, the film-forming conditions such as the temperature conditions can be adjusted within a wider range when the element-forming layer or the like is formed on the substrate 1. This will allow a desired high-temperature process to be used, and will allow more reliable high-performance elements and circuits to be produced when forming multiple elements or circuits on the element-forming substrate.

Accordingly, the element-forming substrate 1 should be made of a material with a strain point that is at least Tmax, where Tmax is the maximum temperature during the formation of the element-forming layer. Specifically, the structural material of the element-forming substrate 1 should have a strain point of at least 350° C., and preferably at least 500° C. Examples of such materials include heat resistant glass such as quartz glass, Corning 7059, and NEC Glass OA-2.

Although the thickness of the element-forming substrate 1 is not particularly limited, it should normally be about 0.1 to 5.0 mm, and preferably about 0.5 to 1.5 mm. That is because light loss is less likely to occur in cases where a thicker substrate 1 has greater strength and a thinner substrate has a lower substrate 1 transmittance. Element-forming substrates 1 with higher light transmittance may be thicker than the aforementioned maximum range.

The element-forming substrate 1 should be of a uniform thickness in order to allow uniform light radiation.

The element-forming substrate thus involves a number of conditions, but because it can be used repeatedly, even if the material is relatively expensive, it is possible to minimize increases in manufacturing costs by reusing the material.

That is, since the element-forming substrate is not a part of the final product, a suitable material for forming the elements can be selected without limiting the strength, thickness, weight, and cost of the final product.

A material that results in separation within the layer or at the interface ("intra-layer separation" or "interfacial separation") when irradiated with light such as laser light should be selected for the peeling layer 2. That is, irradiation with light of a certain intensity should eliminate or diminish the bonding force between the atoms or molecules forming the structural material, resulting in ablation and peeling. The light irradiation sometimes results in the release of gas from the peeling layer 2, leading to separation. When the components contained in the peeling layer 2 are converted to gas and released, resulting in separation, the peeling layer 2 sometimes absorbs the light and is converted to a gas, and vapor is released, resulting in separation.

A through E below are examples of such a peeling layer 2 composition.

A. Amorphous Silicon (a-Si)

Amorphous silicone may contain hydrogen (H). In such cases, the H content should be about 2 atomic % or more, and preferably about 2 to 20 atomic %. When the hydrogen (H) content is at the prescribed level, the hydrogen is released when irradiated with light, internal pressure is produced in the peeling layer 2, resulting in force sufficient to separate the upper and lower thin films. The hydrogen (H) content of the amorphous silicon can be adjusted by setting suitable film-forming conditions, such as CVD gas composition, gas pressure, gas atmosphere, gas flow rate, temperature, substrate temperature, and power supply. Amorphous silicon has good light absorption, allows films to be readily made, and is highly practical. The peeling layer can thus be composed of amorphous silicon for the inexpensive formation of peeling layers that properly separate when irradiated with light.

B. Silicon Oxide or Silicon Oxide Compounds, Titanium Oxide or Titanium Oxide Compounds, Zirconium Oxide or Zirconium Oxide Compounds, Tantalum Oxide or Tantalum Oxide Compounds, or Various Other Oxide Ceramics, Dielectrics (Ferroelectrics) or Semiconductors Examples of silicon oxide include SiO, $SiO_2$, and $Si_3O_2$; examples of silicon oxide compounds include $K_2SiO_3$, $Li_2SiO_3$, $CaSiO_3$, $ZrSiO_4$, and $Na_2SiO_3$.

Examples of titanium oxide include TiO, $Ti_2O_3$, and $TiO_2$; examples of titanium oxide compounds include $BaTiO_4$, $BaTiO_3$, $Ba_2Ti_9O_{20}$, $BaTi_5O_2$, $CaTiO_3$, $SrTiO_3$, $PbTiO_3$, $MgTiO_3$, $ZrTiO_2$, $SnTiO_4$, $Al_2TiO_5$, and $FeTiO_3$.

Examples of zirconium oxide include $ZrO_2$; and examples of zirconium oxide compounds $BaZrO_3$, $ZrSiO_4$, $PbZrO_3$, $MgZrO_3$, $K_2ZrO_3$.

The layer is preferably composed of silicon containing nitrogen. That is because, when silicon containing nitrogen is used for the peeling layer, the nitrogen is released when irradiated with light, thus promoting the separation of the peeling layer.

C. PZT, PLZT, PLLZT, PBZT and Similar Ceramics or Dielectrics (Ferroelectrics)

D. Nitride Ceramics Such as Silicon Nitride, Aluminum Nitride, and Titanium Nitride E. Examples of organic polymer materials include those with bonds such as —CH—, —CO— (ketones), —CONH— (amides), —NH— (imides), —COO— (esters), —N=N— (azo), and —CH=N— (schiff) (such bonds are cleaved by light radiation), particularly any with an abundance of such bonds. the organic polymer material may also have aromatic hydrocarbons (1 or more benzene rings or condensed rings thereof) in the structural formula.

Specific examples of such organic polymer materials include polyolefins such as polyethylene and polypropylene, and polyimides, polyamides, polyesters, polymethyl methacrylates (PMMA), polyphenylene sulfides (PPS), polyether sulfones (PES), and epoxy resins.

F. Metals

Metals include Al, Li, Ti, Mn, In, Sn, Y, La, Ce, Nd, Pr, Gd, Sm or alloys including at least one metal among the above.

The peeling layer can also be composed of an alloy containing hydrogen. That is because exposing a peeling layer made of an alloy containing hydrogen to light will result in the release of the hydrogen, thereby promoting the separation of the peeling layer.

The peeling layer can consist of multiple films. A multi-layer film can consist, for example, of an amorphous silicon film and a metal film formed thereon. Materials for multi-layer films can include at least material from among the aforementioned ceramics, metals, and organic polymer materials. When the peeling layer is thus made of a multi-layer film or a combination of different materials, exposure to light results in the release of hydrogen gas or nitrogen gas, thereby promoting the release of the peeling layer, in the same manner as amorphous silicon.

The thickness of the peeling layer 2 will vary depending on the purpose of the separation and conditions such as the composition of the peeling layer 2, layer structure, and forming method, but should usually be about 1 nm to 20 $\mu$m, preferably about 10 nm to 2 $\mu$m, and even more preferably about 40 nm to 1 $\mu$m. A thicker peeling layer 2 will preserve film uniformity and will result in fewer separation irregularities, whereas a thinner layer will allow less light power (amount of light) to be used in order to ensure good separation in the peeling layer 2, and will take less time for the subsequent removal of the peeling layer. The thickness of the peeling layer 2 should be as uniform as possible.

The method for forming the peeling layer 2 is not particularly limited, provided that it allows the peeling layer 2 to be formed with a uniform thickness, and may be selected according to the film composition and conditions such as the film thickness. Examples include various vapor phase film-forming methods such as CVD (including MOCVD, low pressure CVD, and ECR-CVD), deposition, molecular beam deposition (MB), sputtering, ion plating, and PVD, various plating methods such as electroplating, dipping, and electroless plating, coating methods such as the Langmuir-Blodgett method, spin coating, spray coating, and roll coating, various types of printing methods, transfer methods, ink jet coating methods, and powder jet methods, as well as combinations of two or more of the above.

For example, when the composition of the peeling layer 2 is an amorphous silicon (a-Si), the film is preferably formed by CVD, particularly low pressure CVD or plasma CVD.

When the peeling layer 2 is made of a ceramic by a sol-gel method, the film should be formed by a coating method, particularly spin coating.

Although not shown in FIG. 1A, an interlayer may be placed between the element-forming substrate 1 and the peeling layer 2 in order to improve the adhesion between the two according to the properties of the substrate 1 and peeling layer 2. The interlayer serves at least one function such as the function of a protective layer for physically or chemically protecting the layer that is to be transferred during manufacture or use, an insulating layer, a barrier layer to prevent components from migrating to or from the layer that is to be transferred, or a reflection layer.

The composition of the interlayer may be selected according to the intended purpose. Examples include silicon oxide such as $SiO_2$ in the case of interlayers formed between a layer that is to be transferred and a peeling layer formed of amorphous silicon. Examples of other interlayer compositions include metals such as Pt, Au, W, Ta, Mo, Al, Cr, Ti, or alloys based thereon.

The interlayer thickness may be determined according to the purpose for which it is formed. It should normally be about 10 nm to 5 $\mu$m, and preferably about 40 nm to 1 $\mu$m. A thicker interlayer will preserve film uniformity and will result in fewer adhesion irregularities, whereas a thinner interlayer will result in lower loss of the light transmitted to the peeling layer.

Methods for forming the interlayer can include the various methods described for the peeling layer 2. The interlayer can be formed of a single layer, or can be formed of two or more layers using a plurality of materials with the same or different composition.

An element-forming layer 3 including an element is then formed on the peeling layer 2. The element-forming layer 3 may include TFT or other active or passive elements, or a circuit comprising a combination thereof. Things that can be formed with the element-forming layer 3 include individual elements, individually functioning chips such as integrated circuits, and parts of circuits which do not function individually between the two but which function independently in combination with other elements or circuits. As such, the structure and size are not limited.

It is particularly desirable in the present invention to form an integrated circuit composed of a plurality of thin-film elements with the element-forming layer 3. A process at a certain elevated temperature is required to produce a thin-film element, and the substrate on which the thin-film elements are formed must meet a variety of conditions, as with the element-forming substrate 1. The final transfer substrate serving as the final product can provide a flexible substrate, for example. In the production of such thin-film elements, the requirements for the final substrate and the conditions required of the substrate for producing the thin-film element can be mutually contradictory, but the method for transferring an element according to the present invention can be used to produce a thin-film element with a substrate that meets the manufacturing conditions, and the thin-film element can then be transferred to a transfer substrate that does not meet such manufacturing conditions.

Examples of such thin-film elements include TFT as well as thin-film diodes, photoelectric converter elements comprising a silicon PIN junction (sensors and solar cells), silicon resistor elements, and other thin-film semiconductor devices, electrodes (i.e. transparent electrodes such as mesa films and ITO), switching elements, memory, low voltage elements, actuators such as piezoelectric elements, micromirrors (piezo thin-film ceramics), magnetic recording thin-film heads, coils, inductors, resistors, capacitors, thin-film high-permeability materials and micromagnetic devices combined with them, filters, reflecting films, and dichroic mirrors.

In this embodiment, a thin-film transistor is included in the formation of the element-forming layer 3. That is, as shown in FIG. 1A, the element-forming layer 3 comprises a thin-film transistor composed of an insulation layer 31 such as a silicon oxide film, a silicon layer 32 including an impurity-doped source/drain region, a gate insulating film 33, a gate wiring film 34, an interlayer insulating film 35, a source/drain wiring film 36, and the like.

FIG. 3 illustrates a method for manufacturing a thin-film transistor T as an example of a method for producing the element-forming layer 3.

Figure 3A:
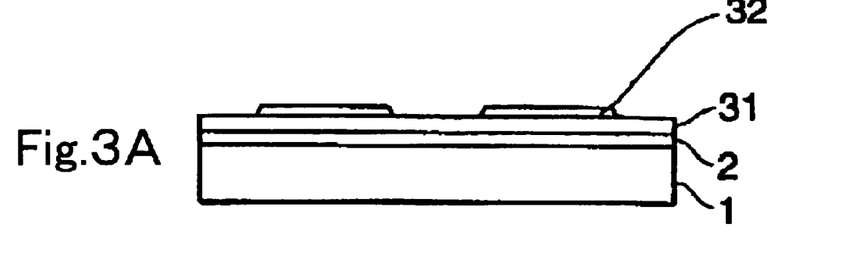
FIGS. 3A through 3D are cross sectional views of the production process illustrating the second embodiment of the present invention.

First, as shown in FIG. 3A, an $SiO_2$ film is deposited on the element-forming substrate 1 to form an insulating layer 31, which is an underlayer. Examples of methods for forming an $SiO_2$ film include well-known methods such as plasma enhanced chemical vapor deposition (PECVD), low pressure chemical vapor deposition (LPCVD), sputtering or similar vapor deposition. A 1 $\mu$m thick insulating layer 31 can be formed, for example, using PECVD. A silicon layer 32 is then formed using a well-known method such as LPCVD. The silicon layer 32 is patterned and formed into the configuration of the semiconductor region of a thin-film transistor.

Figure 3B:
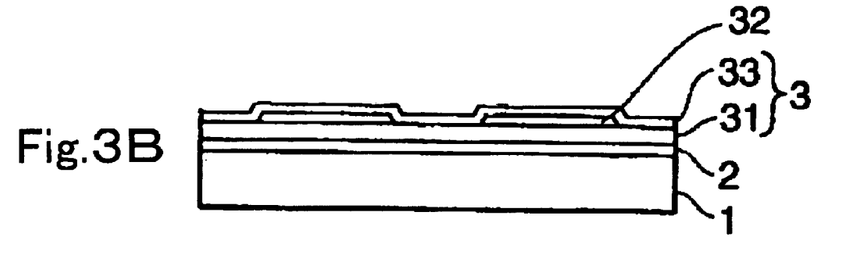

Next, as shown in FIG. 3B, a gate insulating film 33 of $SiO_2$, for example, is formed by a prescribed method, such as electron cyclotron resonance-PECVD (ECR-CVD), parallel plate PECVD, or LPCVD.

Figure 3C:
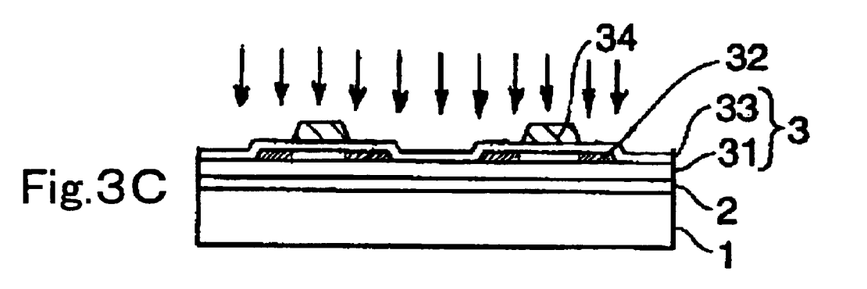

Then, as shown in FIG. 3C, a metal thin film of a prescribed gate metal such as tantalum or aluminum is formed by sputtering, and is then patterned to form a gate wiring film 34. The gate wiring film 34 is then used as a mask for the ion implantation of impurities serving as a donor or acceptor, and source/drain and channel regions are produced in a self-aligned manner relative to the gate wiring film 34 on the patterned silicon layer 32. In order to produce an NMOS transistor, for example, phosphorus (P) is implanted as the impurity element at the prescribed concentration, such as a concentration of $1 \times 10^{16}$ cm$^{-2}$, in the source/drain region. The impurity is then activated by the application of suitable energy, such as with an XeCl excimer laser at a radiation energy density of about 200 to 400 mJ/cm$^2$ or a heat treatment at a temperature of about 250 to 450° C.

Figure 3D:
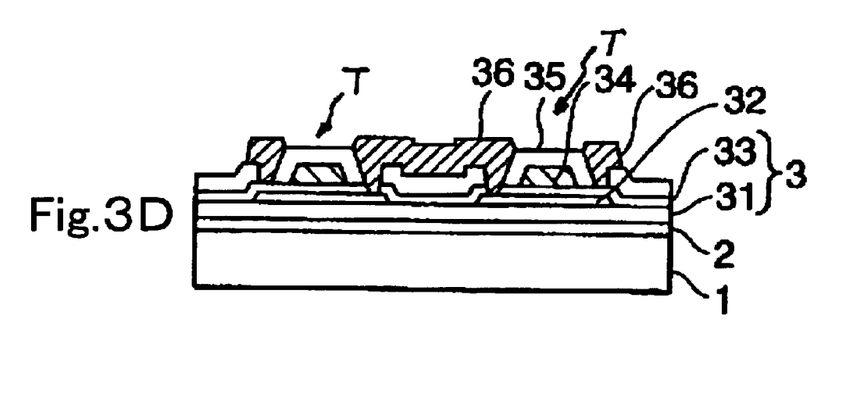

Then, as shown in FIG. 3D, an interlayer insulating film 35 is formed with about 500 nm $SiO_2$ or the like by a prescribed method such as PECVD on the upper surface of the gate wiring film 34 and gate insulating film 33. Contact holes reaching the source/drain region are then provided in the insulating films 33 and 35, and aluminum or the like is deposited by a prescribed method such as sputtering in and around the contact holes to form a wiring film 36 for patterning.

A thin-film transistor T can be formed in the aforementioned step, but various other well-known techniques can also be used as the method for forming the element.

An $SiO_2$ film was used as the insulating layer 31 serving as the underlayer in contact with the peeling layer 2, but other insulating films such as $Si_3N_4$ can also be used. The thickness of the insulating layer 31 may be determined according to the purpose for which it is intended or to the extent to which it is capable of functioning, but is should normally be about 10 nm to 5 $\mu$m, and preferably about 40 nm to 1 $\mu$m. The insulating layer 31 can be formed for various purposes, such as to function as the aforementioned interlayer. That is, the insulating layer can be formed to serve at least one function such as the function of a protective layer for physically or chemically protecting the element(s) formed with the element-forming layer 3, an insulating layer, an electrically conducting layer, a shielding layer against laser light, a barrier layer to prevent migration, or a reflection layer.

When the element-forming layer is susceptible to disintegration or flaking after the separation of the peeling layer, the element(s) may be formed directly on the peeling layer 2 without forming such an insulating layer 31.

Figure 1B:
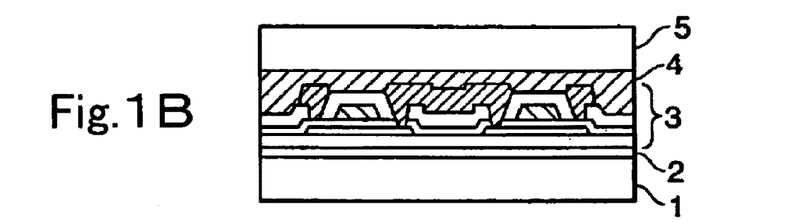

Then, as illustrated in FIG. 1B, the top of the element-forming layer 3 is coated with a dissolvable adhesive such as a water-soluble adhesive to form an adhesion film 4.

An example of an adhesive for the adhesion film 4 is a liquid dissolvable adhesive, particularly a water-soluble adhesive. Desirable examples of such an adhesive can be selected from adhesives which dissolve relatively easily in solvents such as water, alcohol, acetone, ethyl acetate, and toluene, and which allow the adherend to be detached, such as polyvinyl alcohol systems, aqueous vinyl urethane systems, acrylic systems, polyvinyl pyrrolidone, alpha-olefins, maleic acid systems, photocuring adhesives and other such water-soluble adhesives, acrylic adhesives, epoxy adhesives, silicone adhesives and many other organic solvent-soluble adhesives.

In the present embodiment, the adhesive for forming the adhesion film 4 may be applied to just the element-forming layer 3, just the temporary transfer substrate 5, or both.

The adhesion film can be produced by spin coating, ink jet coating using an ink jet type of device described below for forming thin films, printing, or the like.

The temporary transfer substrate 5 is then mounted on top, and the (element-forming layer 3 of the) element-forming substrate 1 and the temporary transfer substrate 5 are laminated together. A glass substrate as described above, for example, can be used for the temporary transfer substrate 5.

Figure 1C:
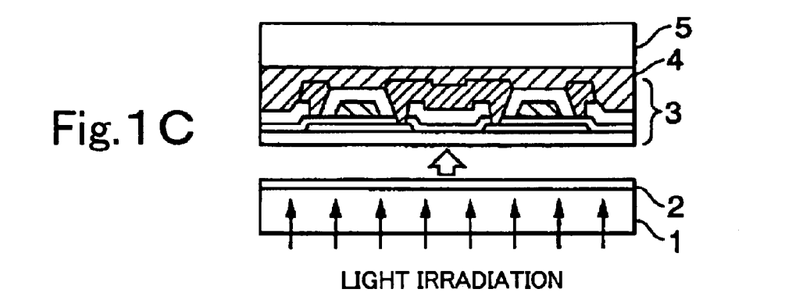

Next, as shown in FIG. 1C, the entire surface is irradiated with laser light, for example, from the first substrate side. This results in ablation in the peeling layer 2, the release of gas contained in the peeling layer 2, subsequent phase changes such as fusion or evaporation, and the separation of the element-forming layer 3 from the element-forming substrate 1 side. This allows the element-forming layer 3 to be transferred to the temporary transfer substrate 5.

As used, here, ablation refers to the photochemical or thermal excitation of a fixed material which has absorbed radiated light, cleaving the bonds of atoms or molecules at the surface or in the interior, which are thus released.

Primarily all or part of the structural material of the peeling layer 2 undergoes a phase transformation such as fusion or evaporation (gasification). The phase change can also result in fine bubbles, which can also reduce the bonding force.

Whether the peeling layer 2 undergoes intralayer separation, interfacial separation, or both is governed by the composition of the peeling layer 2 and various other factors, examples of which include conditions such as the type of light that is radiated, its wavelength, its intensity, and the depth to which it reaches.

The light that is radiated may be any that brings about intralayer and/or interfacial separation in the peeling layer 2, such as X-rays, UV rays, visible light, IR rays (heat rays), laser light, milliwaves, microwaves, electron beams, and radiation (( rays, ( rays, and ( rays).

Of these, laser light is preferred because it readily produces separation (ablation) in the peeling layer 2 and is capable of high-precision irradiation of certain areas. Laser light is coherent light, and is suitable for producing separation in desired areas with high precision by the radiation of high-output pulse light through the element-forming substrate 1 onto the peeling layer. Laser light can thus be used to ensure easy separation of the element-forming layer 3.

Examples of laser devices for producing laser light include various types of gas lasers and solid lasers (semiconductor lasers), but excimer lasers, Nd—YAG lasers, Ar lasers, CO2 lasers, CO lasers, and He—Ne lasers are suitable for use.

Laser light with a wavelength of 100 nm to 350 nm is preferred. The use of such short wavelength laser light can provide higher irradiation precision and more effective separation in the peeling layer 2.

Excimer lasers are an example of laser light meeting the above conditions. Excimers are gas lasers capable of high energy laser light output in the short wavelength ultraviolet region. The use of a combination of a rare gas (such as Ar, Kr, and Xe) and a halogen gas (such as F2 and HCl) as the laser medium can permit the output of laser light with four typical kinds of wavelengths (XeF=351 nm, XeCl=308 nm, KrF=248 nm, and ArF=193 nm). Because excimer lasers are capable of high energy output in the short wavelength region, ablation in the peeling layer 2 can be brought about with extreme rapidity, allowing the element-forming layer 3 to be separated with virtually no increase in the temperature of the adjacent temporary transfer substrate 5 or element-forming substrate 1, and without and deterioration in or damage to the element or the like.

Laser light should have a wavelength of about 350 to 1200 nm when the peeling layer 2 is to be endowed with the property of separating upon phase transformation such as gas release, gasification, or sublimation.

Laser light sources or illumination devices which are widely used in the field of general processing, such as YAG and gas lasers, can be used for laser light with such a wavelength, and will provide an inexpensive and simple way to provide light irradiation. Also, the use of such laser light with a wavelength in the visible light region permits a greater degree of freedom in selecting the element-forming substrate 1, as long as the element-forming substrate 1 is permeable to visible light.

The energy density of the laser light that is radiated, particularly the energy density in the case of excimer lasers, should be about 10 to 5000 mJ/cm2, and more preferably about 100 to 500 mJ/cm2. The irradiation time should be about 1 to 1000 nsec, and preferably about 10 to 100 nsec. A higher energy density or longer irradiation time will more readily result in ablation, whereas a lower energy density or shorter irradiation time can minimize the risk of adverse effects on elements or the like by light passing through the peeling layer 2.

Radiated light such as laser light should be radiated in such a manner as to ensure uniform intensity. The direction in which the light falls may be perpendicular to the peeling layer 2 or tilted at a desired angle toward the peeling layer 2.

When the surface area of the peeling layer 2 is greater than the area of a single pass of radiated light, the entire region of the peeling layer 2 can be irradiated in several passes. The same location can also be irradiated two or more times. The same or different areas can also be irradiated two or more times with different types of light (laser light) having different wavelengths (wavelength bands).

Examples of measures which can be taken when light passing through the peeling layer 2 can potentially have an adverse effect on the element(s) include forming an interlayer as described above of tantalum (Ta) or the like on the peeling layer 2. Alternatively, an insulating layer 31 serving as the underlayer of the element-forming layer may be formed so as to function as in interlayer. This will allow the laser light passing through the peeling layer 2 to be completely reflected at the metal film interface, preventing any adverse effects on elements beyond that.

Residue from the peeling layer 2 can sometimes get stuck to the reverse side of the separated element-forming layer 3, and this should be completely removed. Examples of ways to remove the residual peeling layer 2 can be selected from methods such as washing, etching, ashing, and grinding, or combinations thereof. Parts of the peeling layer 2 that adhere to the surface of the substrate 1 when separated from the element-forming layer 3 can be removed by the same methods to allow the element-forming substrate 1 to be reused (recycled).

Figure 1D:
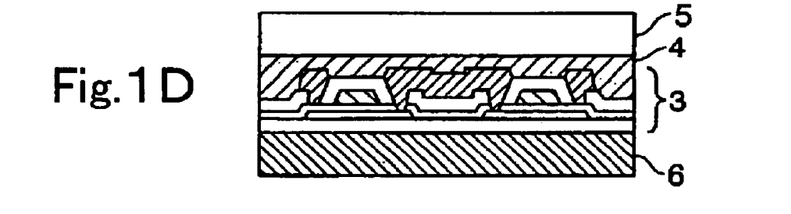

Then, as illustrated in FIG. 1D, a liquid resin material is uniformly applied to the entire surface on the underlayer side of the element-forming layer 3, and is cured by a suitable method for the resin material, such as thermosetting, photocuring, or letting the material stand, so as to form a resin substrate 6.

Examples of resin materials which can be used include one or mixtures of two or more from among thermofusing polyester resins such as polyolefin resins (such as polyethylene, polypropylene, and EVA), epoxy resins, fluororesins, and carboxylated acrylic resins, acrylate resins, and silicone resins. The resin can be applied by spin coating, roll coating, spraying, or various other suitable methods.

The material for the resin substrate 6 is not particularly limited, but properties such as heat resistance and corrosion resistance may be lower than those of the aforementioned substrate 1. Because the resins substrate 6 is provided after the formation of the element requiring elevated heat, there is no need for the temperature conditions used during the formation of the element-forming layer 3.

The structural material for the resin substrate 6 can therefore have a transition point (Tg) or softening point equal to Tmax or lower, where Tmax is the maximum temperature during the formation of the element-forming layer 3. For example, the resin substrate 6 can be made of a material with a transition point (Tg) or softening point of 800(C. or below, preferably 500(C. or below, and even more preferably 320(C. or below.

The materials which can be used for the resin substrate 6 are not limited by temperature, allowing a broader range of materials to be selected and thereby making it easier to ensure that the coefficient of thermal expansion of the element-forming layer and resin substrate are closer together, for example. It is thus possible to form a structure which is less susceptible to cracking or warping caused by heat, and to improve the heat resistance.

The mechanical properties of the resin substrate 6 should allow the substrate to be formed with a certain rigidity (strength), but may also be flexible and elastic to a certain extent. The use of resin substrates that are flexible can result in better properties which cannot be obtained in highly rigid glass substrates. Thus, in the present invention, a flexible final substrate can be used to produce an electro-optical device, for example, thereby realizing an electro-optical device which is flexible and light, yet resistant to impact when dropped.

Various types of resins are preferred as material for forming such a resin substrate 6. The synthetic resin may be either a thermoplastic or thermo-curing resin, examples of which include polyolefins such as polyethylene, polypropylene, ethylene-propylene copolymers, and ethylene-vinyl acetate copolymers (EVA), cyclic polyolefins, modified polyolefins, polyvinyl chloride, polyvinylidene chloride, polystyrene, polyamides, polyimides, polyamide-imides, polycarbonates, poly-(4-methylpentene-1), ionomers, acrylic resins, polymethyl methacrylates, acrylic-styrene copolymers (AS resins), butadiene-styrene copolymers, polyo copolymers (EVOH), polyesters such as polyethylene terephthalate (PET), polybutylene terephthalate (PBT), and polycyclohexane terephthalate (PCT), polyethers, polyether ketones (PEK), polyether ether ketones (PEEK), polyether imides, polyacetal (POM), polyphenylene oxides, modified polyphenylene oxides, polyarylates, aromatic polyesters (liquid crystal polymers), polytetrafluoroethylene, polyvinylidene fluoride, and other fluororesins, various thermoplastic elastomers based on styrene, polyolefins, polyvinyl chlorides, polyurethane, fluororubber, or polyethylene chloride, epoxy resins, phenolic resins, urea resins, melamine resins, unsaturated polyesters, silicone resins, polyurethane, or copolymers based on the above, blends thereof, or polymer alloys thereof. These may be used alone or in combinations of two or more (such as laminates of 2 or more layers).

Examples of glass materials include silicate glass (quartz glass), alkali silicate glass, soda-lime glass, potash lime glass, lead (alkali) glass, barium glass, and borosilicate glass. All of these, except for silicate glass, have a lower melting point than silicate glass, are relatively easy to form and process, and are inexpensive, making them preferable.

The final substrate is made of resin, and thus provides the advantages of lower material and manufacturing costs. It is therefore advantageous to use such synthetic resins to produce large-scale, inexpensive devices (such as liquid crystal displays).

However, other materials can also be used if they are as easy to form and as inexpensive as synthetic resins.

The thickness of the resin substrate 6 is selected according to conditions such as the strength after the resin has been cured, or the thickness, area, strength or the like of the element-forming layer 3 that is being transferred. For example, the thickness should be about 50 to 1000 (m, and preferably 100 to 400 (m. A thicker resin substrate may result in less of an advantage in the present invention in making a thinner final product overall after the removal of the adhesive layer, and a thinner resin substrate may not allow the strength of the final product to be preserved.

An adhesive sheet with a resin material continuously formed in a suitable shape on a flexible sheet is preferably used as the resin substrate 6. That is because continuously providing an adhesive sheet will result in a simpler procedures and good manufacturing efficiency.

Figure 1E:
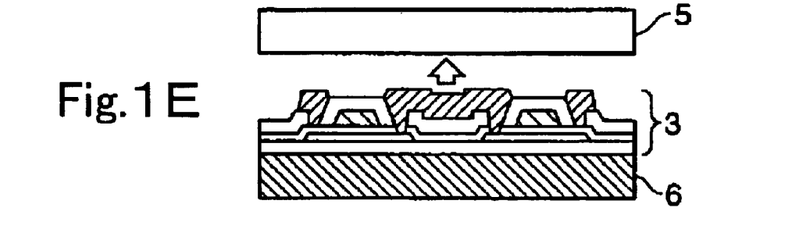

Next, as illustrated in FIG. 1E, the adhesive film 4 is dissolved with a solvent (such as water or an organic solvent) suitable for the properties of the adhesives, such as washing the adhesive with water, and the temporary transfer substrate 5 is separated from the element-forming layer 3.

In the aforementioned steps, a curable resin is applied to the element-forming layer 3 to produce a transfer substrate 6, allowing semiconductor devices to be formed with a plastic resin substrate 6 having a relatively low heat-resistant temperature. Such a process for producing semiconductor devices would be beneficial for applications in processes for producing liquid crystal displays or EL panels.

That is, the first embodiment of the present invention results in a thinner semiconductor device because it has no adhesive layer between the transfer substrate and element-forming layer such as in conventional devices. The material for the resin substrate serving as the underlayer substrate of the element-forming layer may be selected upon a consideration of the adhesion with the element-forming layer and the like, a wide range of materials may be selected, and it is easier to ensure that the thermal expansion properties are closer together. Final products with matching conditions such as the coefficient of thermal expansion are less susceptible to cracking and warping due to heat, and have better heat resistance.

Particularly in cases where a large substrate area is required, such as when the final product is a large-scale display device, a thin resin substrate can be used for the final product while the invention in this embodiment is used to manufacture a pixel circuit for an active matrix substrate with a large surface area on a relatively thick, sturdy element-forming substrate. In other words, it is possible to meet the mutually opposed conditions required for manufacture and the final product, so as to ultimately give a thin final product, while ensuring stable production without causing defects or cracks in the element-forming layer.

Whereas a final substrate is specially laminated with an adhesive or the like in conventional methods of transfer, in this first embodiment of the present invention, a substrate in which a layer formed of resin ultimately supports the circuit as a whole is used, making it possible to produce a far thinner final product than with a conventional method of transfer.

Second Embodiment

The second embodiment of the present invention relates to a second method of transfer in which resin is applied onto the element-forming layer and cured to form a transfer substrate, and the original substrate is removed. More particularly, this is a method of transfer in which there is no need for laminating a previous transfer substrate.

FIGS. 2A through 2E illustrate the process (steps) for producing an element and circuit board in the second embodiment of the invention. Parts that are the same as those in the first embodiment are indicated by the same symbols. In this second embodiment, the use of temporary transfer substrate 5 is omitted and, therefore, the transfer is conducted once.

Figure 2A:
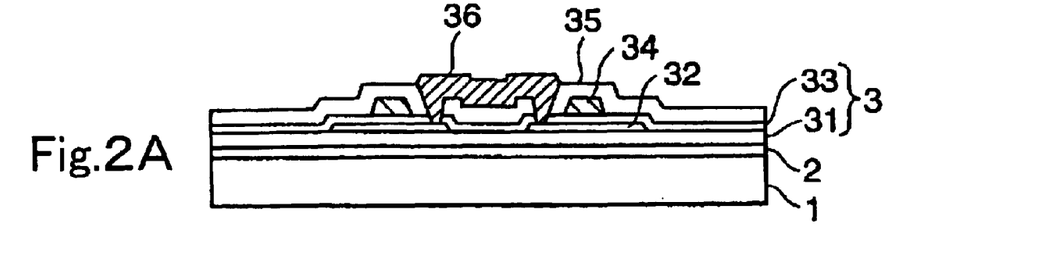
FIGS. 2A through 2E are cross sectional views of the production process illustrating a second embodiment of the present invention.

First, as illustrated in FIG. 2A, a peeling layer 2 is formed on a heat-resistant element-forming substrate 1 such as quartz glass. As described above, the peeling layer 2 has the property of separation through internal separation when exposed to heat, light, or the like. The separation film 2 is the same as that described above for the first embodiment. Amorphous silicon (a-Si) containing hydrogen can be used, for example.

An element-forming layer 3 with which electrical elements such as thin-film transistors are formed is formed on the peeling layer 2. The element-forming layer 3 may be the same as that described above in the first embodiment, and may be composed, for example, of an insulating layer 31 such as a silicone oxide film, a silicon layer including an impurity-doped source/drain region, a gate insulating film 33, a gate wiring film 34, an interlayer insulating film 35, a source/drain wiring film 36, and the like.

Figure 2B:
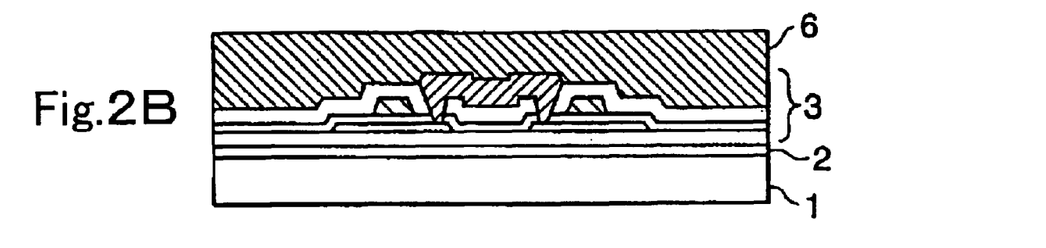

Then, as illustrated in FIG. 2B, a liquid thermosetting or photo-curing resin material is evenly applied over the entire surface of the element-forming layer 3, and the resin material is cured by a suitable method to form a resin substrate 6. The resin material may the same as that described in the first embodiment. Various resins such as acrylic resins and silicone resins can be selected for use, for example. The resin may be applied by a method selected from various types such as spin coating, roll coating, or spraying. The resin can be cured by being exposed to light or heat, etc.

The mechanical strength and thickness of the resin substrate 6 may be the same as those described in the first embodiment.

Figure 2C:
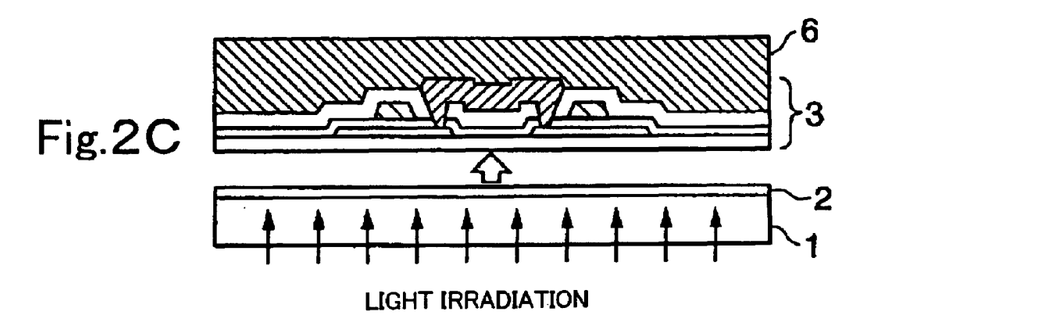

Then, as shown in FIG. 2C, the entire surface is irradiated with laser light, for example, from the element-forming substrate 1 side to bring about separation from the crystal bonds upon the molecular conversion of the hydrogen in the peeling layer 2, resulting in the separation of the element-forming layer 3 from the element-forming substrate 1. The element-forming layer 3 is thereby transferred to the transfer substrate 6. The radiation of the laser light is the same as described above in the first embodiment. An excimer laser may be used, for example.

Figure 2D:
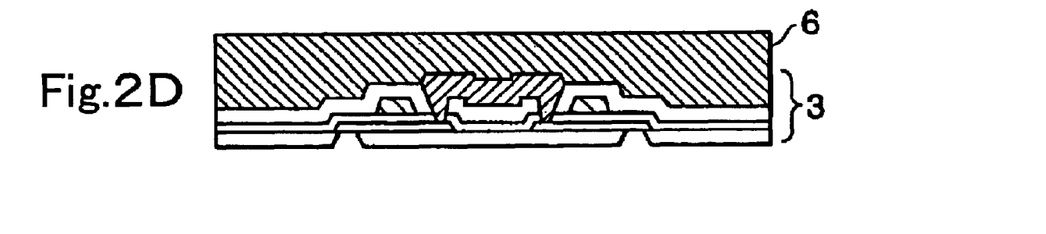

Then, as illustrated in FIG. 2D, the insulating film 31 underneath the element-forming layer 3 is patterned to open contact holes of about 20 to 30 (m, for example. The film may be patterned by photolithography, with drops of etching liquid by an ink jet method, by laser etching, or the like.

Figure 2E:
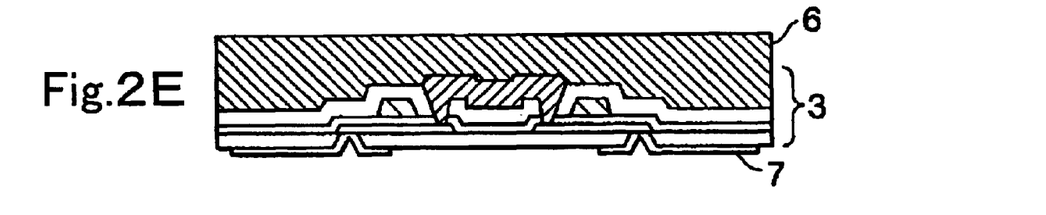

Then as illustrated in FIG. 2E, wiring or electrodes such as transparent electrodes ITO 7 may be laminated to the reverse of the element-forming layer 3 and patterned to form pixel electrodes, terminal electrodes, or the like. This type of circuit boards are used for electro-optical devices such as liquid crystal displays or El displays.

Thus, in the second embodiment, the same effects as in the first embodiment can be obtained without a step involving the use of a temporary transfer substrate 5. That is, an element-forming layer 3 such as an electronic circuit is transferred and formed on a resin substrate 6.

The wiring on the reverse of the element-forming layer in FIGS. 2D and 2E is not necessary, and contact holes or wiring may be omitted.

In particular, in the second embodiment, a layer without any adhesive layer applied by a conventional method is ultimately used as a substrate supporting the entire circuit, making it possible to produce a far thinner final product than with a conventional method of transfer.

Third Embodiment

The third embodiment is an integrated circuit produced by the methods of transfer in the aforementioned embodiments, and is a circuit board.

Figure 4A:
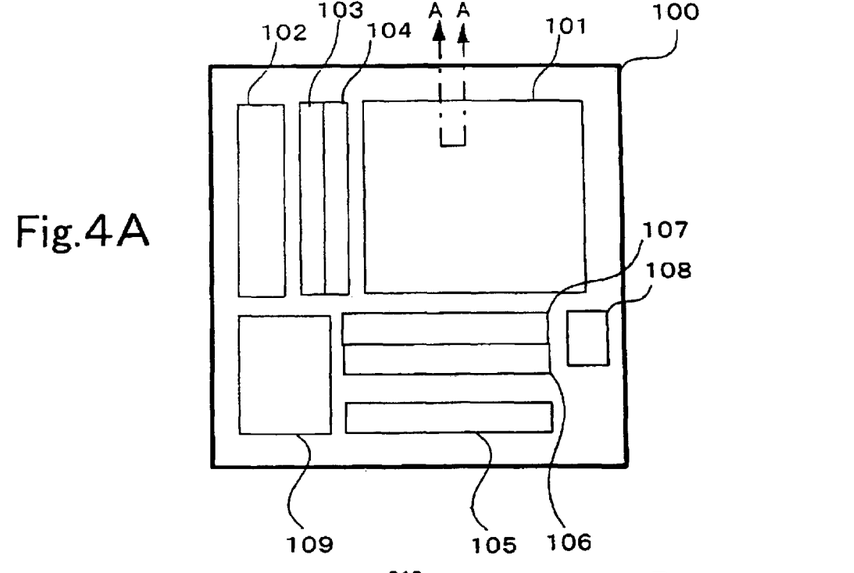
FIG. 4A is a plan.

The integrated circuit in this embodiment relates to a static RAM which is an LSI formed by the method for transferring an element in the present invention. FIG. 4A is a plan of the integrated circuit of this embodiment, FIG. 4B is a partial cross sectional detail of line A—A in FIG. 4A featuring the use of the first embodiment, and FIG. 4C is a partial cross sectional detail of the use of the second embodiment.

As illustrated in FIG. 4A, the integrated circuit 100 comprises individual blocks of a memory array 101, address buffer 102, row decoder 103, word driver 104, address buffer 105, column decoder 106, column selector switch 107, input/output circuit 108, and control circuit 109. Thin-film transistor-based circuits are formed in each block, and wiring comprising patterned metal layers is formed between adjacent blocks.

Figure 4B:
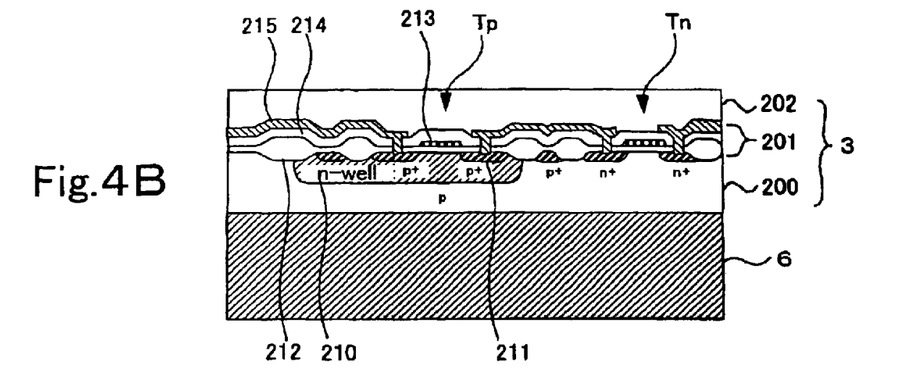
FIG. 4B is a partial cross sectional detail of the use of the first embodiment.
Figure 4C:
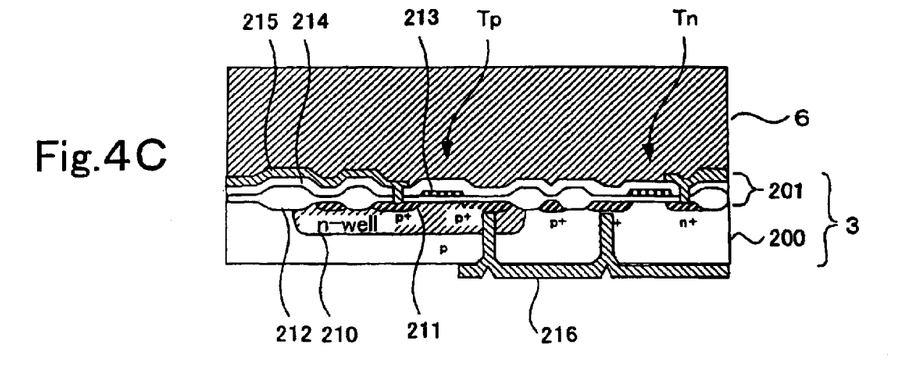
FIG. 4C is a partial cross sectional detail of the use of the second embodiment.

FIG. 4B is a cross section of the application of the first embodiment to produce the integrated circuit 100, indicating the vicinity where p-type MOS transistors Tp and n-type MOS transistors Tn have been formed. As illustrated in the cross section, a resin substrate 6 is formed under an element-forming layer 3. The element-forming layer 3 is formed of an underlayer silicon layer 200, a wiring layer 201 comprising the formation of several elements or wire layer structures, and a protective layer for protecting the upper surface.

A circuit is formed in the wiring layer 201 by means of a well region 210, semiconductor region doped with impurities and forming a source or drain, a gate insulating film 212, a gate wiring film 213, an interlayer insulating film 214, and a metal wiring layer 215. Such a layered structure can be formed by the same procedure for forming the thin-film transistor in the first embodiment.

The protective layer 202 is a film for protecting the wiring layer 201. When the first embodiment is used, the mechanical strength is secured by the underlayer resin substrate 6, which should therefore be thick enough to protect the wiring layer 201, with no need to be made thicker.

FIG. 4C is a cross section of the application of the second embodiment to produce the integrated circuit 100. The silicon layer 200 and wiring layer 201 are the same as in FIG. 4B. However, because here the resin substrate 6 is formed on the upper surface of the wiring layer 201, the resin substrate 6 also functions as a protective layer simultaneously protecting the wiring layer 201. That is, the material for and the thickness of the resin substrate 6 should be selected so as to provide the substrate itself with strength in addition to its function as a protective layer.

As described in the second embodiment, all or part of the metal wiring layer 215 provided in the wiring layer 201 can be provided with a metal wiring layer 216 on the reverse side.

The third embodiment has the same effects as the aforementioned embodiments. In particular, various elements are formed on a silicon wafer in a conventional integrated circuit, but the present invention is employed to allow circuits to be integrated on a silicon layer with a thinner structure than a silicon wafer. That is, a silicon layer 200 capable of functioning as a semiconductor device is formed by a prescribed method such as sputtering on the peeling layer 2, and the wiring layer 201 is then formed to allow a far thinner element-forming layer 3 to be formed.

Fourth Embodiment

The fourth embodiment of the present invention relates to an electro-optical device including an active matrix type of circuit board which is formed when elements produced by the method for transferring an element in the above embodiments are disposed in a plurality of two-dimensionally disposed pixel electrodes.

Figure 5:
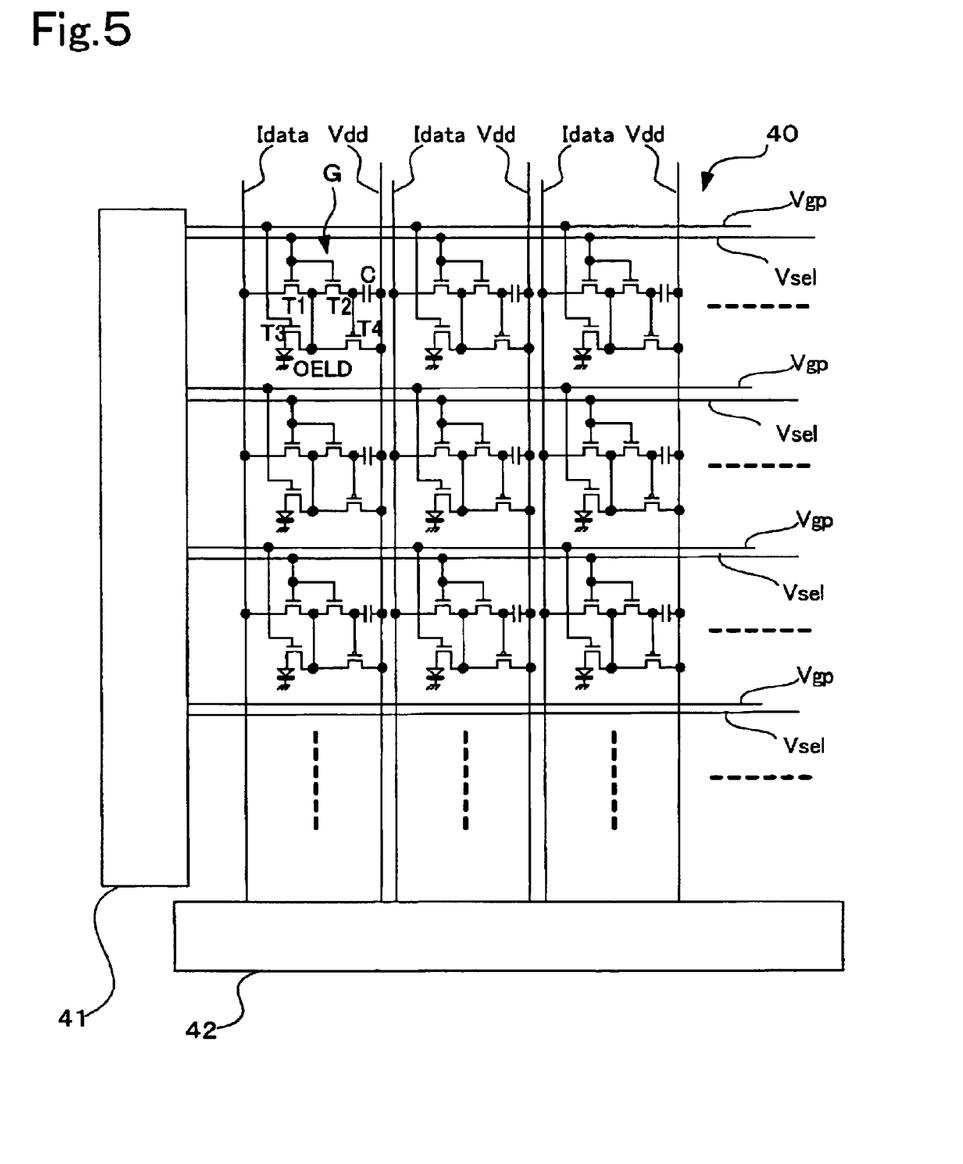
FIG. 5 is a connection diagram of an active matrix substrate and electro-optical device relating to the present invention.

FIG. 5 is a connection diagram of an a electro-optical (display) device 40 in the fourth embodiment. The display device 40 in this embodiment comprises luminescent layers OELD capable of emitting light through electroluminescent effects in each pixel region G, and retention volume C for storing current to drive the above, as well as semiconductor devices transferred and produced by the method of transfer in the present invention, here being thin-film transistors T1 to T4. Scan lines Vsel and luminescence control lines Vgp are provided from the driver region 41 to each of the pixel regions G. Data lines Idata and power lines Vdd are provided from the driver region 42 to each of the pixel regions G. The scanning lines Vsel and data lines Idata are controlled to program the current to each of the pixel regions G, allowing the light produced by the luminescent components OELD to be controlled.

The aforementioned active matrix circuit is an example of a circuit involving the use of an electroluminescence device as a light-emitting element, but other circuit structures are also possible. Various circuit structure modifications will allow liquid crystal display elements to be used for light-emitting elements.

Either the method of transfer in the first embodiment or in the second embodiment can be used to produce the electro-optical device in this embodiment. That is, the active matrix circuit including pixel regions can be formed on an element-forming substrate, and a resin substrate can be formed to remove the transfer-related substrate as in the first embodiment, or a resin layer can be formed on the resin-forming layer and cured to then remove the transfer-related substrate as in the second embodiment.

In the fourth embodiment, the method of transfer in the present invention was used to produce such an active matrix circuit board and an electro-optical device, thus providing the same effects as in the first and second embodiments.

Particularly in the case of an active matrix circuit board with a large area according to the fourth embodiment or an electro-optical device using such a circuit, such as a large-scale display device, the resin substrate of the final product can be provided with a circuit structure while a circuit board with a large area can be produced on a relatively thick and durable element-forming substrate. It is thus possible to meet the mutually contradictory conditions for manufacturing and the final product, allowing a thin final product ultimately to be produced while ensuring stable manufacture without any cracks or defects in the pixel regions.

In the fourth embodiment, it is possible to use a thin resin substrate or a circuit board with a layered structure in the final product, thus making it possible to produce a final product that is far thinner than conventional circuit boards or electro-optical devices.

Fifth Embodiment

The fifth embodiment relates to an electronic appliance produced by the method of transfer in the above embodiments.

The electronic appliance in this embodiment comprises at least in part a circuit board formed by a method of transfer in the present invention.

Figure 6A:
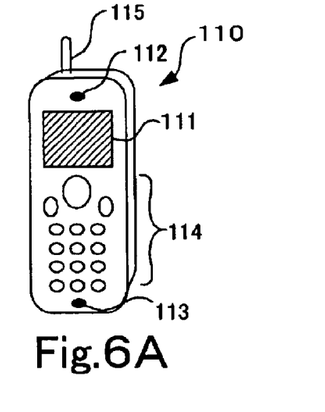
Figure 6B:
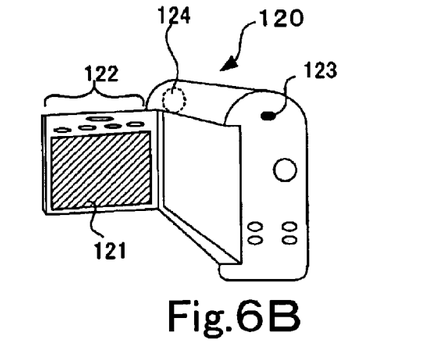

FIGS. 6A through 6B are examples of electronic appliances in the present embodiment.

FIG. 6A is an example of a cellular telephone produced by a method of transfer in the present invention. The cellular telephone 110 comprises an electro-optical device (display panel) 111, voice output component 112, voice input component 113, operating component 114, and antenna component 115. The methods of transfer in the present invention are applicable, for example, to the display panel 111 or internally housed circuit board.

FIG. 6B is an example of a video camera produced by a transfer method of the present invention. The video camera 120 comprises an electro-optical device (display panel) 121, operating component 122, voice input component 123, and imaging component 124. The methods of transfer in the present invention are applicable, for example, to the display panel 121 or internally housed circuit board.

Figure 6C:
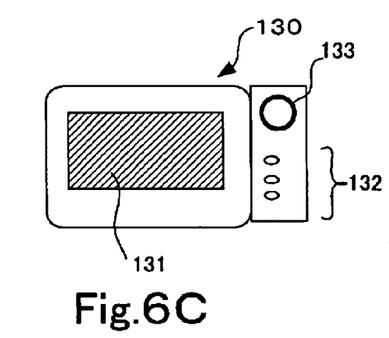

FIG. 6C is an example of a portable personal computer produced by a method of transfer in the present invention. The computer 50 comprises an electro-optical device (display panel) 131, operating component 132, and camera component 133. The methods of transfer in the present invention are applicable, for example, to the display panel 131 or internally housed circuit board.

Figure 6D:
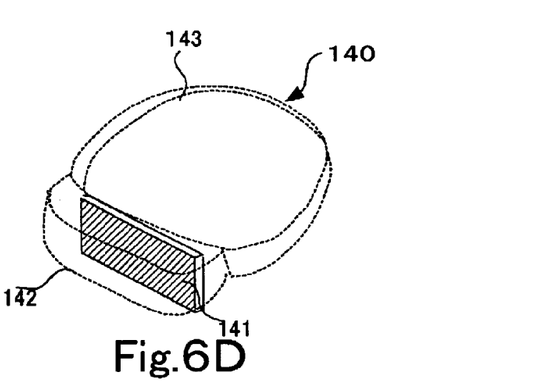

FIG. 6D is an example of a head-mounted display. The head-mounted display 140 comprises an electro-optical device (display panel) 141, optical receiver 142, and band 143. The methods of transfer in the present invention are applicable, for example, to the display panel 141 or internally housed circuit board.

Figure 6E:
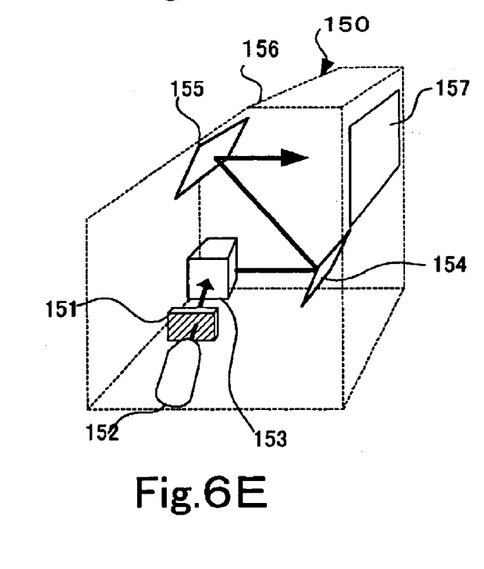

FIG. 6E is an example of a rear projector produced by a method of transfer in the present invention. The rear projector 150 comprises an electro-optical device (optical modulator) 151, light source 152, synthetic optical system 153, mirrors 154 and 155, and a screen 157 housed in a case 156. The methods of transfer in the present invention are applicable, for example, to the optical modulator 151 or internally housed circuit board.

Figure 6F:
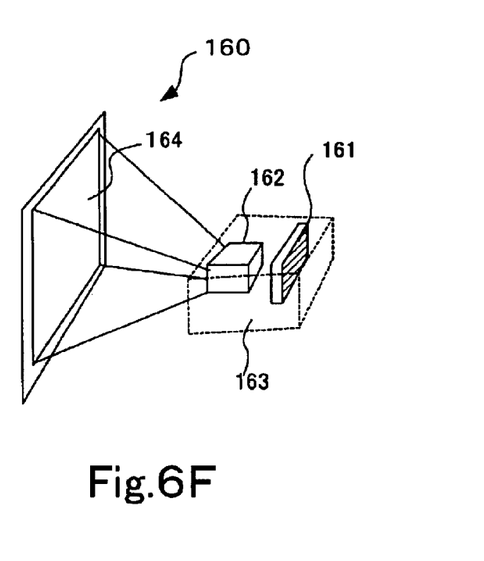

FIG. 6F is an example of a front projector produced by a method of transfer in the present invention. The front projector 160 comprises an electro-optical device (image display source) 161 and optical system 162 housed in a case 163, allowing images to be displayed on a screen 164. The methods of transfer in the present invention are applicable, for example, to the image display source 161 or internally housed circuit board.

The methods of transfer in the present invention, which are not limited to the above examples, are applicable to any electronic appliance involving the use of electronics and circuitry. Other examples include FAX machines with display functions, digital camera finders, portable TV, DSP devices, PDA, electronic organizers, electronic signs, and displays for advertising announcements.

The methods of transfer in the present invention produce the same effects as in the first embodiment. That is, it is possible to obtain an extremely thin thin-film device without an adhesive layer between the element-forming layer and transfer substrate as in the past, making the invention suitable for providing a circuit board forming thin portable electronic appliances.

Sixth Embodiment

The sixth embodiment relates to an IC card as a suitable example of an electronic appliance in the aforementioned fifth embodiment.

Figure 7:
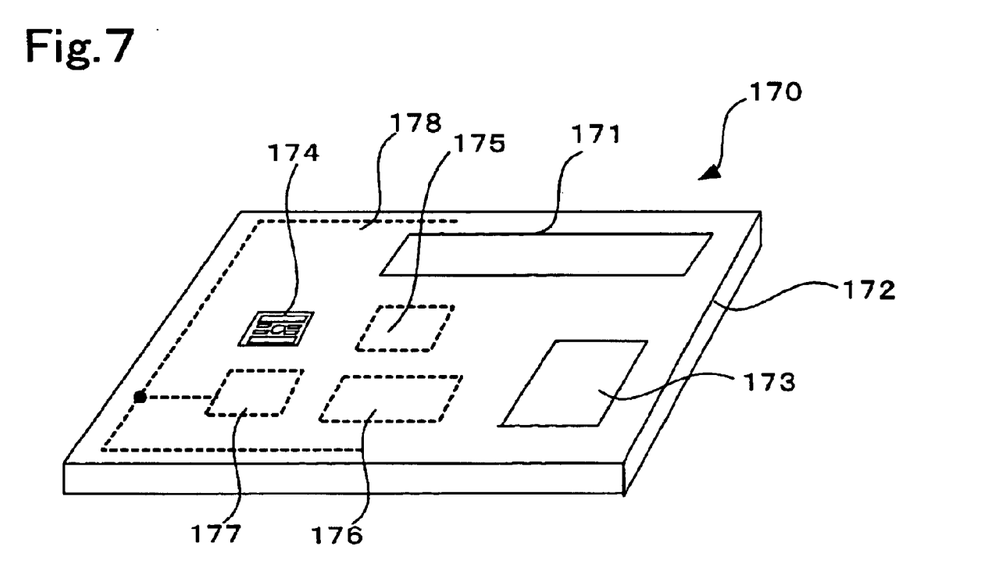
FIG. 7 is a schematic oblique view illustrating the structure of an IC card relating to the present invention.

FIG. 7 is a schematic oblique view illustrating an IC card in this embodiment. As illustrated in FIG. 7, the IC card 170 comprises a display panel 171, fingerprint detector 173, external terminal 174, microprocessor 175, memory 176, communication circuit 177, and antenna 178.

The methods of transfer in the present invention have the same effects as in the first embodiment. That is, it is possible to obtain an extremely thin thin-film device without an adhesive layer between the element-forming layer and transfer substrate as in the past, making the invention particularly suitable for electronic appliances requiring extremely thin circuit boards, such as IC cards.

The methods of transfer in the present invention are not limited to the aforementioned IC card, but are also applicable to devices requiring thin substrates, such as paper currency, credit cards, and prepaid cards.

What is claimed is:

1. A method for transferring an element, comprising:
    forming a peeling layer in which the bonding force weakens under certain conditions on an element-forming substrate for forming an element;
    forming an element layer including an element on the peeling layer;
    joining the element layer with a dissolvable bonding layer to a temporary transfer substrate;
    weakening the bonding force of the peeling layer to peel the element layer from the element-forming substrate, and moving the element layer to the temporary transfer substrate;
    applying resin directly onto a bottom side of the element layer which has been moved to the temporary transfer substrate, and curing the resin to form a sole resin substrate; and
    dissolving the bonding layer to peel the temporary transfer substrate from the resin substrate to produce the element.

2. The method for transferring an element according to claim 1, wherein the bonding layer comprises a liquid dissolvable adhesive.

3. The method for transferring an element according to claim 1, further comprising opening a contact hole in the element layer to form a wired layer or electrode layer.

4. The method for transferring an element according to claim 1, wherein the peeling layer is formed of a material in which the bonding force between atoms or molecules is lost or diminished by the radiation of light.

5. The method for transferring an element according to claim 1, wherein the peeling layer comprises multiple films.

6. The method for transferring an element according to claim 1, wherein the peeling layer comprises at least one material selected from the group consisting of amorphous silicon, silicon nitride, and metals.

7. The method for transferring an element according to claim 1, wherein the peeling layer includes hydrogen.

8. A method for producing an element, comprising:
    forming a peeling layer in which the bonding force weakens under certain conditions on a forming substrate;
    forming an element layer including an element on the peeling layer;
    joining the element layer with a dissolvable bonding layer to a temporary transfer substrate;
    weakening the bonding force of the peeling layer to peel the element layer from the forming substrate, and moving the element layer to the temporary transfer substrate;
    applying resin directly onto a bottom side of the element layer which has been moved to the temporary transfer substrate, and curing the resin to form a sole resin substrate; and
    dissolving the bonding layer to peel the temporary transfer substrate from the resin substrate to produce the element.

9. A method for producing an integrated circuit, comprising:
   forming a peeling layer in which the bonding force weakens under certain conditions on a forming substrate;
   forming an integrated circuit layer including an integrated circuit on the peeling layer;
   joining the integrated circuit layer with a dissolvable bonding layer to a temporary transfer substrate;
   weakening the bonding force of the peeling layer to peel the integrated circuit layer from the forming substrate, and moving the integrated circuit layer to the temporary transfer substrate;
   applying resin directly onto a bottom side of the integrated circuit layer which has been moved to the temporary transfer substrate, and curing the resin to form a sole resin substrate; and
   dissolving the bonding layer to peel the temporary transfer substrate from the resin substrate to produce the integrated circuit.

10. A method for producing a circuit board, comprising:
   forming a peeling layer in which the bonding force weakens under certain conditions on a forming substrate;
   forming a circuit board layer including a circuit board on the peeling layer;
   joining the circuit board layer with a dissolvable bonding layer to a temporary transfer substrate;
   weakening the bonding force of the peeling layer to peel the circuit board layer from the forming substrate, and moving the circuit board layer to the temporary transfer substrate;
   applying resin directly onto a bottom side of the circuit board layer which has been moved to the temporary transfer substrate, and curing the resin to form a sole resin substrate; and
   dissolving the bonding layer to peel the temporary transfer substrate from the resin substrate to produce the circuit board.

11. A method for producing a circuit board, comprising:
   forming a peeling layer in which the bonding force weakens under certain conditions on a forming substrate;
   forming a circuit board comprising elements disposed in a plurality of two dimensionally disposed pixel electrodes on the peeling layer;
   joining the circuit board with a dissolvable bonding layer to a temporary transfer substrate;
   weakening the bonding force of the peeling layer to peel the circuit board from the forming substrate, and moving the circuit board to the temporary transfer substrate;
   applying resin directly onto a bottom side of the circuit board which has been moved to the temporary transfer substrate, and curing the resin to form a sole resin substrate; and
   dissolving the bonding layer to peel the temporary transfer substrate from the resin substrate.

12. A method for producing an electro-optical device having a circuit board, comprising:
   producing the circuit board according to claim 11; and
   producing the electro-optical device using the circuit board.

13. A method for producing an electronic appliance having a circuit board, comprising:
   producing the circuit board according to claim 11; and
   producing the electronic appliance having the circuit board.

14. A method for producing an IC card, comprising:
   forming a peeling layer in which the bonding force weakens under certain conditions on a forming substrate;
   forming an IC card layer including an IC card on the peeling layer;
   joining the IC card layer with a dissolvable bonding layer to a temporary transfer substrate;
   weakening the bonding force of the peeling layer to peel the IC card layer from the forming substrate, and moving the IC card layer to the temporary transfer substrate;
   applying resin directly onto a bottom side of the IC card layer which has been moved to the temporary transfer substrate, and curing the resin to form a sole resin substrate; and
   dissolving the bonding layer to peel the temporary transfer substrate from the resin substrate to produce the IC card.

15. A method for transferring an element, comprising:
   forming a peeling layer in which the bonding force weakens under certain conditions on an element-forming substrate for forming an element;
   forming an element layer including an element on the peeling layer;
   applying resin directly onto a top side of the element layer, and curing the resin to form a resin substrate; and
   weakening the bonding force of the peeling layer to peel the element-forming substrate from the element layer, and moving the element layer to the resin substrate to produce the element.

16. The method for transferring an element according to claim 15, further comprising opening contact holes in the element layer to form a wired layer or electrode layer.

17. The method for transferring an element according to claim 15, wherein the peeling layer is formed of a material in which the bonding force between atoms or molecules is lost or diminished by the radiation of light.

18. The method for transferring an element according to claim 15, wherein the peeling layer comprises multiple films.

19. The method for transferring an element according to claim 15, wherein the peeling layer comprises at least one material selected from the group consisting of amorphous silicon, silicon nitride, and metals.

20. The method for transferring an element according to claim 15, wherein the peeling layer includes hydrogen.

21. A method for producing an element, comprising:
   forming a peeling layer in which the bonding force weakens under certain conditions on a forming substrate;
   forming an element layer including an element on the peeling layer;
   applying resin directly onto a top side of the element layer, and curing the resin to form a resin substrate; and
   weakening the bonding force of the peeling layer to peel the fanning substrate from the element layer, and moving the element layer to the resin substrate to produce the element.

22. A method for producing an integrated circuit, comprising:

forming a peeling layer in which the bonding force weakens under certain conditions on a forming substrate;

forming an integrated circuit layer including an integrated circuit on the peeling layer;

applying resin directly onto a top side of the integrated circuit layer, and curing the resin to form a resin substrate; and weakening the bonding force of the peeling layer to peel the forming substrate from the integrated circuit layer, and moving the integrated circuit layer to the resin substrate to produce the integrated circuit.

23. A method for producing a circuit board, comprising:

forming a peeling layer in which the bonding force weakens under certain conditions on a forming substrate;

forming a circuit board layer including a circuit board on the peeling layer;

applying resin directly onto a top side of the circuit board layer, and curing the resin to form a resin substrate; and weakening the bonding force of the peeling layer to peel the forming substrate from the integrated circuit layer, and moving the integrated circuit layer to the resin substrate to produce the circuit board.

24. A method for producing a circuit board, comprising:

forming a peeling layer in which the bonding force weakens under certain conditions on a forming substrate;

forming a circuit board comprising elements disposed in a plurality of two dimensionally disposed pixel electrodes on the peeling layer;

applying resin directly onto a top side of the circuit board, and curing the resin to form a resin substrate; and weakening the bonding force of the peeling layer to peel the forming substrate from the circuit board, and moving the circuit board to the resin substrate.

25. A method for producing an electro-optical device having a circuit board, comprising:

producing the circuit board according to claim 24; and producing the electro-optical device using the circuit board.

26. A method for producing an electronic appliance having a circuit board, comprising:

producing the circuit board according to claim 24; and producing the electronic appliance having the circuit board.

27. A method for producing an IC card, comprising:

forming a peeling layer in which the bonding force weakens under certain conditions on a forming substrate;

forming an IC card layer including an IC card on the peeling layer;

applying resin directly onto a top side of the IC card layer, and curing the resin to form a resin substrate; and weakening the bonding force of the peeling layer to peel the forming substrate from the IC card layer, and moving the IC card layer to the resin substrate to produce the IC card.

* * * * *